United States Patent
Sasaki et al.

(10) Patent No.: US 8,987,721 B2
(45) Date of Patent: Mar. 24, 2015

(54) ORGANIC ELECTROLUMINESCENT ELEMENT AND LIGHTING FIXTURE

(75) Inventors: Hiroyuki Sasaki, Osaka (JP); Hirofumi Kubota, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/006,445

(22) PCT Filed: Mar. 9, 2012

(86) PCT No.: PCT/JP2012/056115
§ 371 (c)(1),
(2), (4) Date: Sep. 20, 2013

(87) PCT Pub. No.: WO2012/128078
PCT Pub. Date: Sep. 27, 2012

(65) Prior Publication Data
US 2014/0014933 A1    Jan. 16, 2014

(30) Foreign Application Priority Data
Mar. 24, 2011    (JP) .................................. 2011-066566

(51) Int. Cl.
*H01L 51/50*    (2006.01)
*H01L 51/52*    (2006.01)
(Continued)

(52) U.S. Cl.
CPC .......... *H01L 51/504* (2013.01); *H01L 51/5044* (2013.01); *H01L 51/5203* (2013.01); *H01L 51/5237* (2013.01); *H01L 2251/5361* (2013.01);
(Continued)

(58) Field of Classification Search
CPC ..................... H01L 51/504; H01L 51/5044

USPC .......................... 257/40; 313/504; 438/22–45
See application file for complete search history.

(56) References Cited

U.S. PATENT DOCUMENTS

| | | |
|---|---|---|
| 6,528,188 B1 | 3/2003 | Suzuki et al. |
| 7,329,984 B2 | 2/2008 | Nagara et al. |
| 8,222,806 B2 | 7/2012 | Jou et al. |

(Continued)

FOREIGN PATENT DOCUMENTS

| | | |
|---|---|---|
| JP | 3589960 | 11/2004 |
| JP | 2006-172763 | 6/2006 |

(Continued)

OTHER PUBLICATIONS

D'Andrade et al., "Controlling Exciton Diffusion in Multilayer White Phosphorescent Organic Light Emitting Devices", Advanced Materials, 14, No. 2, Jan. 16, 2002, pp. 147-151.

(Continued)

*Primary Examiner* — Daniel Shook
(74) *Attorney, Agent, or Firm* — Greenblum & Bernstein, P.L.C.

(57) ABSTRACT

The objective of the present invention is to propose an organic electroluminescent element capable of realizing lighting with which a person feels comfortable irrespective of change in luminance of emitted light. The organic electroluminescent element according to the present invention is constituted by a plurality of layers stacked. The organic electroluminescent element has such characteristics that, in a range of 100 cd/m$^2$ to 6000 cd/m$^2$ inclusive, a color temperature of emitted light increases with an increase in luminance of the emitted light in a direction identical to a direction in which the plurality of layers are stacked.

6 Claims, 5 Drawing Sheets

(51) Int. Cl.
*H05B 33/02* (2006.01)
*H05B 33/10* (2006.01)

(52) U.S. Cl.
CPC .......... *H01L 2251/558* (2013.01); *H05B 33/02* (2013.01); *H05B 33/10* (2013.01)
USPC .......................................................... 257/40

(56) References Cited

U.S. PATENT DOCUMENTS

| | | | |
|---|---|---|---|
| 8,637,858 B2 * | 1/2014 | Huang et al. | 257/40 |
| 2006/0125380 A1 | 6/2006 | Nagara et al. | |
| 2008/0185971 A1 * | 8/2008 | Kinoshita | 315/169.3 |
| 2010/0102712 A1 | 4/2010 | Jou et al. | |
| 2012/0248424 A1 | 10/2012 | Sasaki | |

FOREIGN PATENT DOCUMENTS

| | | |
|---|---|---|
| JP | 2010-109364 | 5/2010 |
| JP | 2011-70963 | 4/2011 |
| WO | 2005/106835 | 11/2005 |
| WO | 2010/140549 | 12/2010 |
| WO | 2012/053216 | 4/2012 |

OTHER PUBLICATIONS

Takahashi, "Effects of Color Temperature and Illuminance of Room Lighting upon the Evaluation to the Residential Living Space", Medical Welfare Research, 30, vol. 2, 2006, together with a partial English translation thereof.

International Search Report in PCT/JP2012/056115, mail date is Jun. 19, 2012.

* cited by examiner

ORGANIC ELECTROLUMINESCENT ELEMENT AND LIGHTING FIXTURE

TECHNICAL FIELD

The present invention relates to an organic electroluminescent element and a lighting fixture including the organic electroluminescent element.

BACKGROUND ART

Organic electroluminescent elements (organic light emitting diodes) are attracting intention as next-generation light sources that can be utilized as flat panel displays, backlights for liquid crystal display devices, light sources for lighting and the like, because of reasons such as being capable of surface emission at high luminance with a low voltage.

Patent Literature 1 discloses one example of conventional organic electroluminescent elements. In this organic electroluminescent element, a light emitting layer is constituted by a hole transporting light emitting layer in which a hole transporting material to which a first fluorescent material is added serves as a matrix, and an electron transporting light emitting layer in which an electron transporting material to which a second fluorescent material is added serves as a matrix. The hole transporting light emitting layer and the electron transporting light emitting layer are caused to emit light at the same time so that the color of light emitted from these light emitting layers is perceived as a mixed color, and both first fluorescent material of the hole transporting light emitting layer and second fluorescent material of the electron transporting light emitting layer are respectively made of two or more types of fluorescent materials such that the emission spectrum of light with a color emitted from the hole transporting light emitting layer is approximately the same as that of light with a color emitted from the electron transporting light emitting layer. The wavelengths of the peak in fluorescence of these two or more types of fluorescent material in a solid state are different from each other. The organic electroluminescent element disclosed in Patent Literature 1 is proposed from the point of view of preventing a chromaticity change in the color of emitted light that accompanies a change in the amount of applied current or the elapse of emission time.

CITATION LIST

Patent Literature
  Patent Literature 1: JP 3589960 B

SUMMARY OF INVENTION

Technical Problem

Incidentally, luminance of light emitted from an organic electroluminescent element is adjusted according to a situation where the element is used. How to design the organic electroluminescent element to provide lighting which allows a person to feel comfortable even when luminance is changed has not been sufficiently examined in the past. The present inventors have newly focused on and investigated this problem. Organic electroluminescent elements to solve this problem have not yet been developed.

To develop such an organic electroluminescent element, it is presumable that an organic electroluminescent element is individually designed to have luminance and a color temperature of light emitted therefrom in order to meet a purpose thereof. However, in this case, to fulfill various purposes, a wide variety of organic electroluminescent elements are necessary. This causes increases in a material cost, a development cost, and takt time accompanied by switching product types. Hence, there has been a problem that it is difficult to lower a production cost. Additionally, a user would be forced to select appropriate one from a wide variety of products in accordance with a usage environment.

In view of the above insufficiency, the present invention has aimed to propose: an organic electroluminescent element capable of realizing lighting with which a person feels comfortable irrespective of change in luminance according to a usage environment: and a lighting fixture including this organic electroluminescent element.

Solution to Problem

The organic electroluminescent element according to the present invention is characterized in that, in a range luminance of light emitted in a front direction of 100 cd/m$^2$ to 6000 cd/m$^2$ inclusive, a color temperature of emitted light increases with an increase in luminance.

In the organic electroluminescent element according to the present invention, it is preferable that, in a case where the luminance of the emitted light in the front direction falls within a range of 100 cd/m$^2$ to 5000 cd/m$^2$ inclusive, a difference between a maximum and a minimum of the color temperature of the emitted light is equal to 500 K or more.

In the organic electroluminescent element according to the present invention, it is preferable that, in a case where the luminance of the emitted light in the front direction falls within a range of 500 cd/m$^2$ to 3000 cd/m$^2$ inclusive, the color temperature of the emitted light falls within a white range defined by JIS Z9112.

In the organic electroluminescent element according to the present invention, it is preferable that in an XY chromaticity diagram in CIE 1931 XYZ color space, a locus representing change in a color of the emitted light along with an increase in the luminance of the emitted light crosses a blackbody locus.

The organic electroluminescent element according to the present invention includes a first electrode, a first light emitting unit, an interlayer, a second light emitting unit, and a second electrode which are stacked in this order. The first light emitting unit includes a blue region light emitting layer designed to emit blue light and a first green region light emitting layer designed to emit green light via fluorescence. The second light emitting unit includes a red region light emitting layer designed to emit red light and a second green region light emitting layer designed to emit green light via phosphorescence. A rate of a thickness of the red region light emitting layer to a thickness of the second green region light emitting layer falls within a range of 2 to 30%.

Preferably, the thickness of the second green region light emitting layer falls within a range of 10 nm to 40 nm.

The lighting fixture according to the present invention includes the aforementioned organic electroluminescent element.

Advantageous Effects of Invention

The present invention can realize lighting with which a person feels comfortable irrespective of change in luminance of emitted light in accordance with a usage environment.

DESCRIPTION OF EMBODIMENTS

Figure 1:
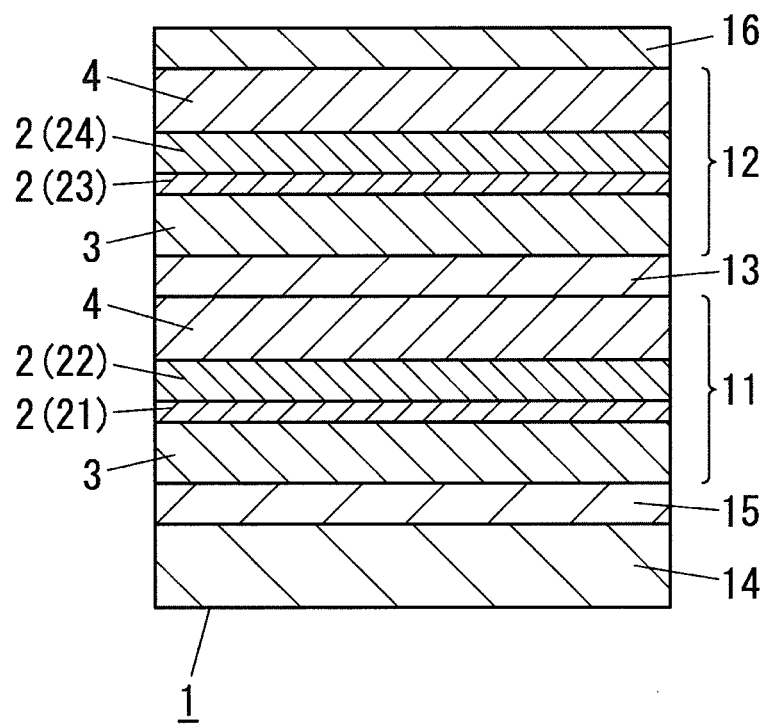
FIG. 1 is a cross-sectional view schematically showing the layer structure of an organic electroluminescent element in an embodiment of the present invention.

FIG. 1 schematically shows one example of the structure of the organic electroluminescent element (organic light emitting diode) in the present embodiment. The organic electroluminescent element 1 is defined as a multi-unit element including a first light emitting unit 11, a second light emitting unit 12, and an interlayer 13 interposed between the first light emitting unit 11 and the second light emitting unit 12.

The organic electroluminescent element 1 has a structure in which a substrate 14, a first electrode 15, the first light emitting unit 11, the interlayer 13, the second light emitting unit 12, and a second electrode 16 are stacked in this order.

It is preferable that the substrate 14 is light transmissive (transparent or translucent). The substrate 14 may be colorless and transparent or slightly colored. The substrate 14 may have a frosted glass appearance.

Examples of material for the substrate 14 include transparent glass such as soda-lime glass and alkali-free glass; and plastic such as polyester resin, polyolefin resin, polyamide resin, epoxy resin, and fluorine-based resin. The shape of the substrate 14 may be a film-like shape or a plate-like shape.

It also is preferable that the substrate 14 has a light diffusion effect. Examples of the structure of this substrate 14 include a structure that includes a matrix phase and particles, a powder, bubbles, or the like that are dispersed in this matrix phase and have a different refractive index from that of the matrix phase; a structure in which shaping processing for improving light diffusion is performed on the surface; and a structure in which a light scattering film or microlens film is placed on the surface of a substrate in order to improve light diffusion.

In the case where it is not necessary for the substrate 14 to transmit light emitted from the organic electroluminescent element 1, the substrate 14 does not need to be light transmissive. In this case, there is no particular limitation on the material for the substrate 14 as long as the element does not lose emission properties, lifetime characteristics, and the like. However, it is preferable that the substrate 14 is formed of a material having high thermal conductivity, such as a metal foil made of aluminum, from the point of view of suppressing a temperature increase in the element.

The first electrode 15 functions as an anode. The anode of the organic electroluminescent element 1 is the electrode for injecting holes into a light emitting layer 2. It is preferable that the first electrode 15 is formed of a material such as a metal, alloy, or electrically conductive compound that has a large work function, or a mixture thereof. Particularly, it is preferable that the electrode 15 is formed of a material having a work function of 4 eV or greater. In other words, it is preferable that the work function of the first electrode 15 is greater than or equal to 4 eV. Examples of a material for forming this first electrode 15 include metal oxides such as ITO (indium-tin oxide), $SnO_2$, ZnO, and IZO (indium-zinc oxide). The first electrode 15 can be formed with an appropriate method such as vacuum vapor deposition, sputtering, or coating, using these materials. In the case where the first electrode 15 is to transmit light emitted from the organic electroluminescent element 1, it is preferable that the light transmittance of the first electrode 15 is greater than or equal to 70%, and it is more preferable that it is greater than or equal to 90%. Furthermore, it is preferable that the sheet resistance of the first electrode 15 is less than or equal to several hundred $\Omega/\square$, and it is particularly preferable that it is less than or equal to $100\Omega/\square$. The thickness of the first electrode 15 is appropriately selected such that properties such as the light transmittance and sheet resistance of the first electrode 15 are approximately desired values. Although the favorable thickness of the first electrode 15 changes depending on the material constituting the first electrode 15, the thickness of the first electrode 15 may be selected to less than or equal to 500 nm, and preferably selected in the range of 10 nm to 300 nm.

It is preferable that a hole injection layer is placed on the first electrode 15 in order to inject holes from the first electrode 15 into the light emitting layer 2 at a lowered voltage. Examples of the material for forming the hole injection layer include a conductive polymer such as PEDOT/PSS or polyaniline, a conductive polymer that is doped with any acceptor or the like, and a material having conductivity and a light transmissive property such as carbon nanotubes, CuPc (copper phthalocyanine), MTDATA[4,4',4"-Tris(3-methyl-phenylphenylamino)triphenylamine], TiOPC (titanyl phthalocyanine), and amorphous carbon. In the case where the hole injection layer is formed of a conductive polymer, for example, the conductive polymer is processed into an ink form, and then it is formed into a film with a method such as a coating or printing to form the hole injection layer. In the case where the hole injection layer is formed of a low molecular organic material or an inorganic substance, for example, the hole injection layer is formed with a vacuum vapor deposition method or the like.

The second electrode 16 functions as a cathode. The cathode of the organic electroluminescent element 1 is the electrode for injecting electrons into the light emitting layer 2. It is preferable that the second electrode 16 is formed of a material such as a metal, alloy, or electrically conductive compound that has a small work function, or a mixture thereof. Particularly, it is preferable that the second electrode 16 is formed of a material having a work function of 5 eV or less. In other words, it is preferable that the work function of the second electrode 16 is less than or equal to 5 eV. Examples of a material for forming such a second electrode 16 include Al, Ag, and MgAg. The second electrode 16 can be formed of an $Al/Al_2O_3$ mixture or the like. In the case where the second electrode 16 is to transmit light emitted from the organic electroluminescent element 1, it is preferable that the second electrode 16 is constituted by multiple layers, and a portion of the multiple layers are formed of a transparent conductive material typified by ITO, IZO, and the like. The second electrode 16 can be formed with an appropriate method such as vacuum vapor deposition or sputtering, using these materials. In the case where the first electrode 15 is to transmit light emitted from the organic electroluminescent element 1, it is preferable that the light transmittance of the second electrode 16 is 10% or less. However, in the case where the second electrode 16 is to transmit light emitted from the organic electroluminescent element 1, it is preferable that the light transmittance of the second electrode 16 is 70% or more. The thickness of the second electrode 16 is appropriately selected such that properties such as the light transmittance and sheet resistance of the second electrode 16 are approximately desired values. Although the favorable thickness of the second electrode 16 changes depending on the material constituting the second electrode 16, the thickness of the second electrode 16 may be selected to less than or equal to 500 nm, and preferably selected in the range of 20 nm to 300 nm.

It is preferable that an electron injection layer is placed on the second electrode 16 in order to inject electrons from the second electrode 16 into the light emitting layer 2 at a lowered voltage. Instances of the material for forming the electron injection layer include an alkali metal, alkali metal halides, alkali metal oxides, alkali metal carbonates, an alkaline earth metal, and an alloy including these metals. Specific instances thereof include sodium, a sodium-potassium alloy, lithium, lithium fluoride, $Li_2O$, $Li_2CO_3$, magnesium, MgO, a magnesium-indium mixture, an aluminum-lithium alloy, and an Al/LiF mixture. The electron injection layer can be formed by an organic layer that is doped with an alkali metal such as lithium, sodium, cesium, or calcium, an alkaline earth metal, or the like.

The first light emitting unit 11 includes the light emitting layer 2. The first light emitting unit 11 may further include a hole transport layer 3, an electron transport layer 4, etc. as necessary. The second light emitting unit 12 also includes a light emitting layer 2. The second light emitting unit 12 may also further include a hole transport layer 3, an electron transport layer 4, etc. as necessary. Each light emitting unit has a layered structure of for instance, the hole transport layer 3/one or more light emitting layers 2/the electron transport layer 4.

In this embodiment, the first light emitting unit 11 includes, as the light emitting layers 2, a blue region light emitting layer 21 and a green region light emitting layer 22 (a first green region light emitting layer 22) producing fluorescence. The blue region light emitting layer 21 serves as the light emitting layer 2 designed to emit blue light, and the first green region light emitting layer 22 serves as the light emitting layer 2 designed to emit green light. On the other hand, the second light emitting unit 12 includes, as the light emitting layers 2, a red region light emitting layer 23 and a green region light emitting layer 24 (a second green region light emitting layer 24) exhibiting phosphorescence. The red region light emitting layer 23 serves as the light emitting layer 2 designed to emit red light, and the second green region light emitting layer 24 serves as the light emitting layer 2 designed to emit green light.

Each light emitting layer 2 can be formed of an organic material (host material) that is doped with a luminescent organic substance (dopant).

Any material selected from an electron transporting material, a hole transporting material, and an electron transporting and hole transporting material can be used as the host material. The electron transporting material and the hole transporting material may be used together with each other as the host material. The host material may be formed so as to have a concentration gradient inside the light emitting layer 2. For instance, the light emitting layer 2 may be formed such that the concentration of the hole transporting material increases as the distance from the first electrode 15 decreases inside the light emitting layer 2, and the concentration of the electron transporting material increases as the distance from the second electrode 16 decreases. There is no particular limitation on the electron transporting material and the hole transporting material that are used as the host material. For instance, the hole transporting material can be appropriately selected from materials that can constitute the hole transport layer 3 described later. Moreover, the electron transporting material can be appropriately selected from materials that can constitute the electron transport layer 4 described later.

Instances of the host material constituting the first green region light emitting layer 22 include Alq3 (tris(8-oxoquinoline) aluminum (III)), ADN, and BDAF. Instances of the fluorescent dopant in the first green region light emitting layer 22 include C545T (coumarineC545T; 10-2-(benzothiazolyl)-2,3,6,7-tetrahydro-1,1,7,7-tetramethyl-1H,5H,11H-(1)benzopyro pyrano(6,7,-8-ij)quinolizine-11-one)), DMQA, coumarin6, and rubrene. It is preferable that the concentration of the dopant in the first green region light emitting layer 22 is in the range of 1 to 20% by mass.

Instances of the host material constituting the second green region light emitting layer 24 include CBP, CzTT, TCTA, mCP, and CDBP. Instances of the phosphorescent dopant in the second green region light emitting layer 24 include $Ir(ppy)_3$ (fac-tris)(2-phenylpyridine)iridium), $Ir(ppy)_2(acac)$, and $Ir(mppy)_3$. It is preferable that the concentration of the dopant in the second green region light emitting layer 24 is in the range of 1 to 40% by mass.

Instances of the host material constituting the red region light emitting layer 23 include CBP(4,4'-N,N'-dicarbazole biphenyl), CzTT, TCTA, mCP, and CDBP. Instances of the dopant in the red region light emitting layer 23 include $Btp_2Ir$(acac)(bis-(3-(2-(2-pyridyl)benzothienyl)mono-acethylacetonate)iridium (III)), $Bt_2Ir(acac)$, and PtOEP. It is preferable that the concentration of the dopant in the red region light emitting layer 23 is in the range of 1 to 40% by mass.

Instances of the host material constituting the blue region light emitting layer 21 include TBADN(2-t-butyl-9,10-di(2-naphthyl)anthracene), ADN, and BDAF. Instances of the dopant in the blue region light emitting layer 21 include TBP(1-tert-butyl-perylene), BCzVBi, and perylene. Instances of a charge transfer promoting dopant include NPD (4,4'-bis[N-(naphthyl)-N-phenyl-amino]biphenyl), TPD(N,N'-bis(3-methylphenyl)-(1,1'-biphenyl)-4,4'-diamine), and Spiro-TAD. It is preferable that the concentration of the dopant in the blue region light emitting layer 21 is in the range of 1 to 30% by mass.

Each light emitting layer 2 can be formed with an appropriate method, instances of which include a dry process such as vacuum vapor deposition or transfer, and a wet process such as spin coating, spray coating, dye coating, or gravure printing.

The material constituting the hole transport layer 3 (hole transporting material) is appropriately selected from a group of compounds having a hole transporting property. It is preferable that the hole transporting material is a compound that has a property of donating electrons and is stable when undergoing radical cationization due to electron donation. Instances of the hole transporting material include: triarylamine-based compounds, amine compounds containing a carbazole group, amine compounds containing fluorene derivatives, and starburst amines (m-MTDATA), representative instances of which include polyaniline, 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4'-4"-tris(N-(3-methylphenyl)N-phenylamino)triphenylamine (MTDATA), 4,4'-N,N'-dicarbazole biphenyl (CBP), spiro-NPD, spiro-TPD, spiro-TAD, and TNB; and 1-TMATA, 2-TNATA, p-PMTDATA, TFATA or the like as a TDATA-based material, but the hole transporting material is not limited to these, and any hole transport material that is generally known is used. The hole transport layer 3 can be formed with an appropriate method such as vapor deposition.

It is preferable that the material for forming the electron transport layer 4 (electron transporting material) is a compound that has the ability to transport electrons, can accept electrons injected from the second electrode 16, and produces excellent electron injection effects on the light emitting layer 2, and moreover, prevents the movement of holes to the electron transport layer 4 and is excellent in terms of thin film formability. Instances of the electron transporting material include Alq3, oxadiazole derivatives, starburst oxadiazole, triazole derivatives, phenylquinoxaline derivatives, and silole derivatives. Specific instances of the electron transporting material include fluorene, bathophenanthroline, bathocuproine, anthraquinodimethane, diphenoquinone, oxazole, oxadiazole, triazole, imidazole, anthraquinodimethane, 4,4'-N,N'-dicarbazole biphenyl (CBP), etc., and compounds thereof, metal-complex compounds, and nitrogen-containing five-membered ring derivatives. Specifically, instances of metal-complex compounds include tris(8-hydroxyquinolinato)aluminum, tri(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)(o-cresolate)gallium, bis(2-methyl-8-quinolinato)(1-naphtholate)aluminum, and bis(2-methyl-8-quinolinato)-4-phenylphenolato, but are not limited thereto. Preferable instances of nitrogen-containing five-membered ring derivatives include oxazole, thiazole, oxadiazole, thiadiazole, and triazole derivatives, and specific instances thereof include 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4"-biphenyl)1,3,4-oxadiazole, 2,5-bis(1-naphthyl)-1,3,4-oxadiazole, 1,4-bis[2-(5-phenylthiadiazoly)]benzene, 2,5-bis(1-naphthyl)-1,3,4-triazole, and 3-(4-biphenylyl)-4-phenyl-5-(4-t-butylphenyl)-1,2,4-triazole, but are not limited thereto. Instances of the electron transporting material include the polymer material used for the polymer organic electroluminescent element 1. Instances of this polymer material include polyparaphenylene and derivatives thereof, and fluorene and derivatives thereof. There is no particular limitation on the thickness of the electron transport layer 4, and for instance, it is formed to have a thickness in the range of 10 to 300 nm. The electron transport layer 4 can be formed with an appropriate method such as vapor deposition.

The interlayer 13 serves the function of electrically connecting two light emitting units in series. It is preferable that the interlayer 13 has high transparency and is highly thermally and electrically stable. The interlayer 13 can be formed of a layer that forms an equipotential surface, a charge generation layer, or the like. Instances of the material for a layer that forms an equipotential surface or charge generation layer include: a thin film of metal such as Ag, Au, or Al; metal oxides such as vanadium oxide, molybdenum oxide, rhenium oxide, and tungsten oxide; a transparent conductive film such as ITO, IZO, AZO, GZO, ATO, or $SnO_2$; a so-called laminate of an n-type semiconductor and a p-type semiconductor; a laminate of a metal thin film or transparent conductive film, and either one of or both an n-type semiconductor and a p-type semiconductor; a mixture of an n-type semiconductor and a p-type semiconductor; and a mixture of a metal and either one of or both an n-type semiconductor and a p-type semiconductor. There is no particular limitation on the n-type semiconductor and the p-type semiconductor, and any semiconductors selected as necessary are used. The n-type semiconductor and the p-type semiconductor may be formed of either an inorganic material or an organic material. The n-type semiconductor and the p-type semiconductor may be a mixture of an organic material and a metal; a combination of an organic material and a metal oxide; or a combination of an organic material and an organic acceptor/donor material or inorganic acceptor/donor material. The interlayer 13 can be formed of BCP:Li, ITO, NPD:$MoO_3$, Liq:Al, or the like. BCP represents 2,9-dimethyl-4,7-diphenyl-1,10-phenanthroline. For instance, the interlayer 13 can have a two-layered configuration obtained by disposing a first layer made of BCP:Li on the anode side, and a second layer made of ITO on the cathode side. It is preferable that the interlayer 13 has a layer structure such as Alq3/$Li_2$O/HAT-CN6, Alq3/$Li_2$O, or Alq3/$Li_2$O/Alq3/HAT-CN6.

In the organic electroluminescent element 1 according to the present embodiment, in a range of luminance of light emitted in a front direction of 100 cd/$m^2$ to 6000 cd/$m^2$ inclusive, a color temperature of emitted light increases with an increase in the luminance. The front direction is defined as a direction identical to a direction in which a plurality of layers constituting the organic electroluminescent element 1 are stacked, and a direction in which light is emitted.

In a case where a person views a light source, the luminance and the color temperature of light emitted from such a light source correlate with person's comfortable or uncomfortable feeling. The high color temperature is preferable when the luminance of emitted light is high, and the low color temperature is preferable when the luminance of emitted light is low (cf. Kruithor, A. A 1941 Tubular luminescence Lamps for general illumination cited in 30 Medical and Welfare Research, vol. 2, 2006). Since the organic electroluminescent element 1 according to the present embodiment has luminance-color temperature characteristics mentioned above, the color temperature increases with an increase in the luminance of emitted light and the color temperature decreases with a decrease in the luminance of emitted light. Hence, it is possible to realize comfortable lighting even if a usage environment changes. Since the color temperature is changed in accordance with an environmental temperature, the aforementioned luminance-color temperature characteristics can be realized by using only one element. Thus, comfortable lighting can be realized at a lowered cost.

A person feels comfortable with light emitted from the organic electroluminescent element 1 when the luminance of light emitted in the front direction falls within a range of 100 cd/$m^2$ to 5000 cd/$m^2$. Hence, in a case where, like a stand light for illuminating one's hands, the light source (organic electroluminescent element) is positioned close to one's eyes and is used at a relatively low luminance (e.g., in a range of 100 to 1500 cd/$m^2$), by adjusting the color temperature to be less than 3000 K, workability can be maintained without causing a person to feel uncomfortable. In contrast, in a case where, like an in-room ceiling light, the organic electroluminescent element is used at relatively high luminance (e.g., 1500 cd/$m^2$ or more), by adjusting the color temperature to be greater than 3000 K, a person can work comfortably.

It is preferable that the organic electroluminescent element 1 is designed such that the luminance of light emitted therefrom (luminance of light emitted therefrom in the front direction) falls within a range of 100 cd/$m^2$ to 5000 cd/$m^2$. In this case, one type of the organic electroluminescent element is available for a wide range of application such as a stand light for illuminating hands of a person and an in-room ceiling light. Hence, the production cost can be lowered.

Further, it is preferable that, in a case where the luminance of the emitted light in the front direction falls within a range of 100 cd/m$^2$ to 5000 cd/m$^2$ inclusive, a difference between a maximum and a minimum of the color temperature of the emitted light is equal to 500 K or more. In other words, it is preferable that a difference between the color temperature corresponding to the luminance of light emitted in the front direction of 100 cd/m$^2$ and the color temperature corresponding to the luminance of light emitted in the front direction of 5000 cd/m$^2$ is equal to 500 K or more. In this case, even when the luminance is changed, a person never feels uncomfortable, and particularly can realize a difference in workability at a low temperature region, for example. This is because a person can sense a difference between the color temperatures which is equal to 500 K or more. The upper limit of the difference between the color temperatures is not limited to particular one but it is preferable that the difference is equal to 1000 K or less because it is not preferable that a color of an illuminated object which is perceived by a person is excessively changed depending on change in the luminance.

It is also preferable that, in a case where the luminance of the emitted light in the front direction of the organic electroluminescent element 1 falls within a range of 500 cd/m$^2$ to 3000 cd/m$^2$ inclusive, the color temperature of the emitted light falls within a white range defined by JIS Z9112. In this case, it is possible to change the color temperature within the white range. Hence, it is possible to make a color of an illuminated object natural.

It is also preferable that, in the XY chromaticity diagram in CIE 1931 XYZ color space, the locus representing change in the color of the emitted light along with an increase in the luminance of the emitted light crosses the blackbody locus. In this case, since change in the color of the emitted light gives a locus crossing the blackbody locus cross, differences between colors perceived by a person are clear and therefore workability can be improved.

The organic electroluminescent element 1 according to the present embodiment is realized as follows.

The luminance of light emitted from the organic electroluminescent element 1 can be adjusted by use of an intensity of light emitted from the light emitting layer 2 designed to emit light in a green region related to a sensitive luminosity function. In contrast, the color temperature of light emitted from the organic electroluminescent element 1 can be adjusted by use of the intensity of light emitted from the light emitting layer 2 designed to emit light in a blue region and the intensity of light emitted from the light emitting layer 2 designed to emit light in a red region. Further, each of the intensity of light emitted from the light emitting layer 2 designed to emit light in a blue region and the intensity of light emitted from the light emitting layer 2 designed to emit light in a red region can be adjusted by use of a film thickness thereof, a concentration of dopant, a configuration of a transport layer in a vicinity thereof, and a configuration of the interlayer 13, for example.

Generally, the color temperature is defined by a spectrum of light emitted from an object with heat through blackbody radiation. In contrast, the color temperature of a light source is determined mainly based on one selected from lines of the blackbody radiation as an approximation of a spectrum of white light suitable for lighting purposes (cf. JIS Z8725: 1999). In brief, provided that a shape of a spectrum of light emitted from the organic electroluminescent element 1 is determined, the color temperature can be calculated in view of intensities of luminosity function curves at respective wavelengths.

For example, the fact that the color temperature is high means that in view of proportions of components of the red, green, and blue regions into which a white spectrum is divided, a relative intensity of a component extending from the green region to the red region is relatively low and a relative intensity of a component extending from the blue region to the green region is relatively high.

The luminance of light emitted from the organic electroluminescent element 1 is approximately proportional to magnitude of a current supplied to the organic electroluminescent element 1. Hence, light emitting characteristics in which the color temperature of emitted light increases with an increase in the luminance of emitted light mean that with an increase in the magnitude of the supplied current to the organic electroluminescent element 1 the relative intensity of the component extending from the green region to the red region decreases and the relative intensity of the component extending from the blue region to the green region increases.

In the present embodiment, the organic electroluminescent element 1 includes the light emitting layer 2 designed to emit red light, the light emitting layer 2 designed to emit green light, and the light emitting layer 2 designed to emit blue light. Hence, the relative values of the intensity of light emitted from the light emitting layer 2 designed to emit green light and the intensity of light emitted from the light emitting layer 2 designed to emit red light need only increase more than the relative value of the intensity of light emitted from the light emitting layer 2 designed to emit blue light with a decrease in the supplied current, and the relative values of the intensity of light emitted from the light emitting layer 2 designed to emit blue light and the intensity of light emitted from the light emitting layer 2 designed to emit green light need only increase more than the relative value of the intensity of light emitted from the light emitting layer 2 designed to emit red light with an increase in the supplied current.

In a case where the plurality of light emitting layers 2 are connected in series with each other, if magnitude of a current supplied to the organic electroluminescent element 1 is kept constant, the intensity of light emitted from the light emitting layer 2 designed to emit red light, the intensity of light emitted from the light emitting layer 2 designed to emit green light, and the intensity of light emitted from the light emitting layer 2 designed to emit blue light are likely to fluctuate depending on carrier balance in the organic electroluminescent element 1. The magnitude of a current is defined by the total number of electric charges which is the sum of the number of electrons and the number of holes. With regard to each light emitting layer 2, one of conditions for maximizing a relative value of intensity of light emitted from a light emitting layer 2 is that a ratio of the number of electrons to the number of holes is close to 1:1.

In the present embodiment, the organic electroluminescent element 1 is a multiunit element including the first light emitting unit 11, the second light emitting unit 12, and the interlayer 13 interposed between the first light emitting unit 11 and the second light emitting layer 12. With regard to such a multiunit element, one of methods for realizing the element in which the color temperature increases with an increase in the luminance of emitted light is to design an element such that with regard to the second light emitting unit 12, the carrier balance in the red region light emitting layer 23 is more deteriorated and carrier balance in the second green region light emitting layer 24 adjacent to this red region light emitting layer 23 is more improved as the luminance of emitted light increases. In other words, an element is designed such that the intensity of light emitted from the red region light emitting layer 23 decreases when the carrier balance in the whole organic electroluminescent element 1 is changed such that the number of holes is greater than that of electrons in response to an increase in the luminance of emitted light.

In a concrete embodiment, for example, an element is designed such that the second green region light emitting layer 24 is placed close to the cathode and the red region light emitting layer 23 is placed close to the anode in the second light emitting unit 12 and a rate of the thickness of the red region light emitting layer 23 to the thickness of the second green region light emitting layer 24 falls within a range of 2 to 30%. In this case, when the luminance of emitted light increases and the number of holes increases, the carrier balance of holes and electrons is more optimized in the second green region light emitting layer 24 than in the red region light emitting layer 24. Consequently, the relative value of the intensity of light emitted from the red region light emitting layer 23 decreases and the relative value of the intensity of light emitted from the second green region light emitting layer 23 increases. Hence, the color temperature of emitted light shifts to a high temperature side.

Figure 2:
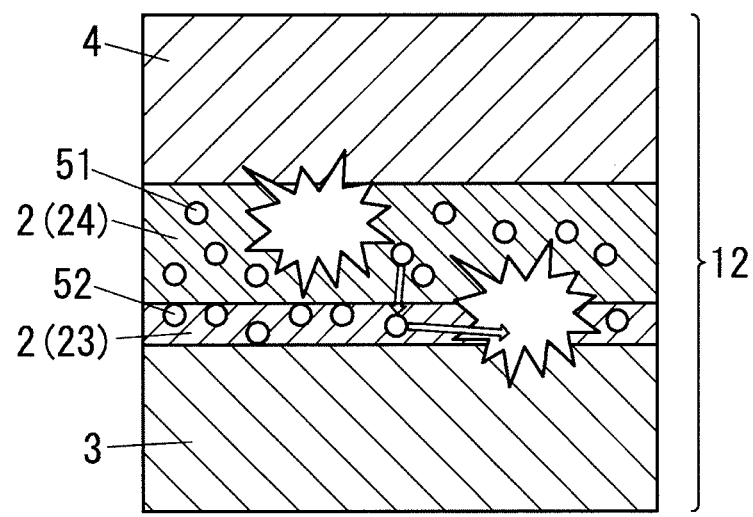
FIG. 2 is an estimated mechanism diagram showing a mechanism estimated to be the cause of the occurrence of a drop in emission intensity in a green region.

Additionally, energy of an exciton produced in the second green region light emitting layer 24 is likely to be transferred to the red region light emitting layer 23. Hence, even if the carrier balance in the second green region light emitting layer 24 is improved when the luminance of emitted light is high, energy transfer from the second green region light emitting layer 24 to the red region light emitting layer 23 is likely to cause an increase in the relative value of the intensity of light emitted from the red region light emitting layer 23 (see FIG. 2). FIG. 2 shows a mechanism estimated to cause the occurrence of a drop in intensity of emitted light in the green region. As for FIG. 2, the reference number 51 designates a phosphorescent dopant (green dopant) in the second green region light emitting layer 24 and the reference number 52 designates a dopant (red dopant) in the red region light emitting layer 23. The reason why transfer of energy from the second green region light emitting layer 24 to the red region light emitting layer 23 occurs is presumably as follows. An exciton at the time of emitting phosphorescence usually has a longer exciton lifetime than that of fluorescent material because of transition from a triplet, and therefore energy transfer from the second green region light emitting layer 24 containing phosphorescent dopants to the red region light emitting layer 23 noticeably appears. The amount of energy transfer from the second green region light emitting layer 24 to the red region light emitting layer 23 can be controlled by adjusting the exciton lifetime, the movement distance of an exciton, the concentration of dopant, and the like.

Besides, as the thickness of the second green region light emitting layer 24 increases, the movement distance of an exciton from the second green region light emitting layer 24 to the red region light emitting layer 23 increases, and therefore the amount of transferred energy decreases. Also, as the thickness of the red region light emitting layer 23 decreases and/or the concentration of dopant in the red region light emitting layer 23 decreases, energy is unlikely to be transferred from the green region light emitting layer 22 to the red region light emitting layer 23. Thus, by adjusting the thickness of the second green region light emitting layer 24, the thickness of the red region light emitting layer 23, the concentration of dopant in the red region light emitting layer 23, and the like, it is possible to design the element such that energy transfer from the second green region light emitting layer to the red region light emitting layer 23 which occurs accompanied with an increase in the luminance of emitted light is reduced.

To reduce energy transfer from the second green region light emitting layer 24 to the red region light emitting layer 23 which occurs accompanied with an increase in the luminance of emitted light, it is preferable that the rate of the thickness of the red region light emitting layer 23 to the thickness of the second green region light emitting layer 24 falls within a range of 2 to 30%. In such a case, it is possible to obtain the structure which includes the red region light emitting layer 23 sufficiently thinned to enable suppressing transfer of energy of an exciton from the second green region light emitting layer 24 to the red region light emitting layer 23. In this case, it is preferable that the thickness of the second green region light emitting layer falls within a range of 10 nm to 40 nm.

Methods for designing an element such that the organic electroluminescent element 1 has a rich number of holes entirely when the luminance of emitted light increases include a method of increasing the number of holes and a method of increasing the hole mobility.

For example, the method of increasing the number of holes may be a method of promoting hole injection from the anode at the high luminance (i.e., a large current or high voltage region). To realize this, it is preferable that an element is designed such that a difference between HOMO levels of the anode and the hole injection layer is equal to 0.3 eV or less. In this case, the number of holes injected can be increased when the band is bent in a large current region (=a high voltage region, e.g., 6 V).

For example, the method of increasing the hole mobility may be a method of using, an organic material for forming the organic electroluminescent element 1, a material in which at a high temperature a rate of increase in hole mobility increases more than a rate of increase in electron mobility. In this case, when the mobility in the transport layer is relatively low, charges remain in organic layers other than the light emitting layers 2. Hence, voltage division occurs inside the organic electroluminescent element 1 and division voltages applied to the organic layers are lowered. Consequently, the field intensities in the organic layers are decreased and therefore movement of electrons is suppressed.

To satisfy a condition that in the XY chromaticity diagram in CIE 1931 XYZ color space, the locus representing change in the color of the emitted light along with an increase in the luminance of the emitted light crosses the blackbody locus, it is sufficient that with regard to the second light emitting unit 12 the film thickness of the red region light emitting layer 23 is less than the film thickness of the second green region light emitting layer 24. The rate of the thickness of the red region light emitting layer 23 to the thickness of the second green region light emitting layer 24 preferably falls within a range of 2% to 30%.

To satisfy a condition that in a case where the luminance of the emitted light in the front direction of the organic electroluminescent element 1 falls within a range of 500 cd/m$^2$ to 3000 cd/m$^2$ inclusive, the color temperature of the emitted light falls within a white range defined by JIS Z9112, it is sufficient that with regard to the second light emitting unit 12 the film thickness of the red region light emitting layer 23 is less than the film thickness of the second green region light emitting layer 24. The rate of the thickness of the red region light emitting layer 23 to the thickness of the second green region light emitting layer 24 preferably falls within a range of 2% to 30% and more preferably in a range of 3% to 10%.

Figure 3:
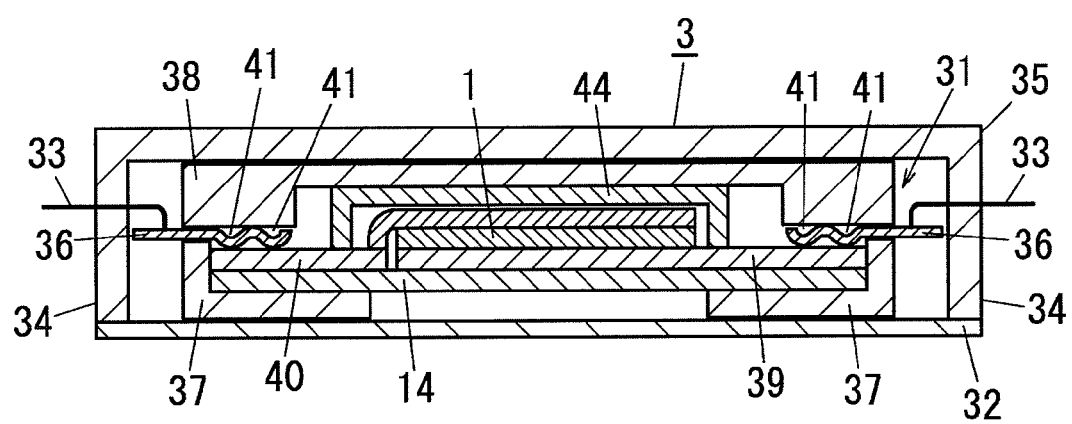
FIG. 3 is a cross-sectional view showing a lighting fixture in an embodiment of the present invention.
Figure 4:
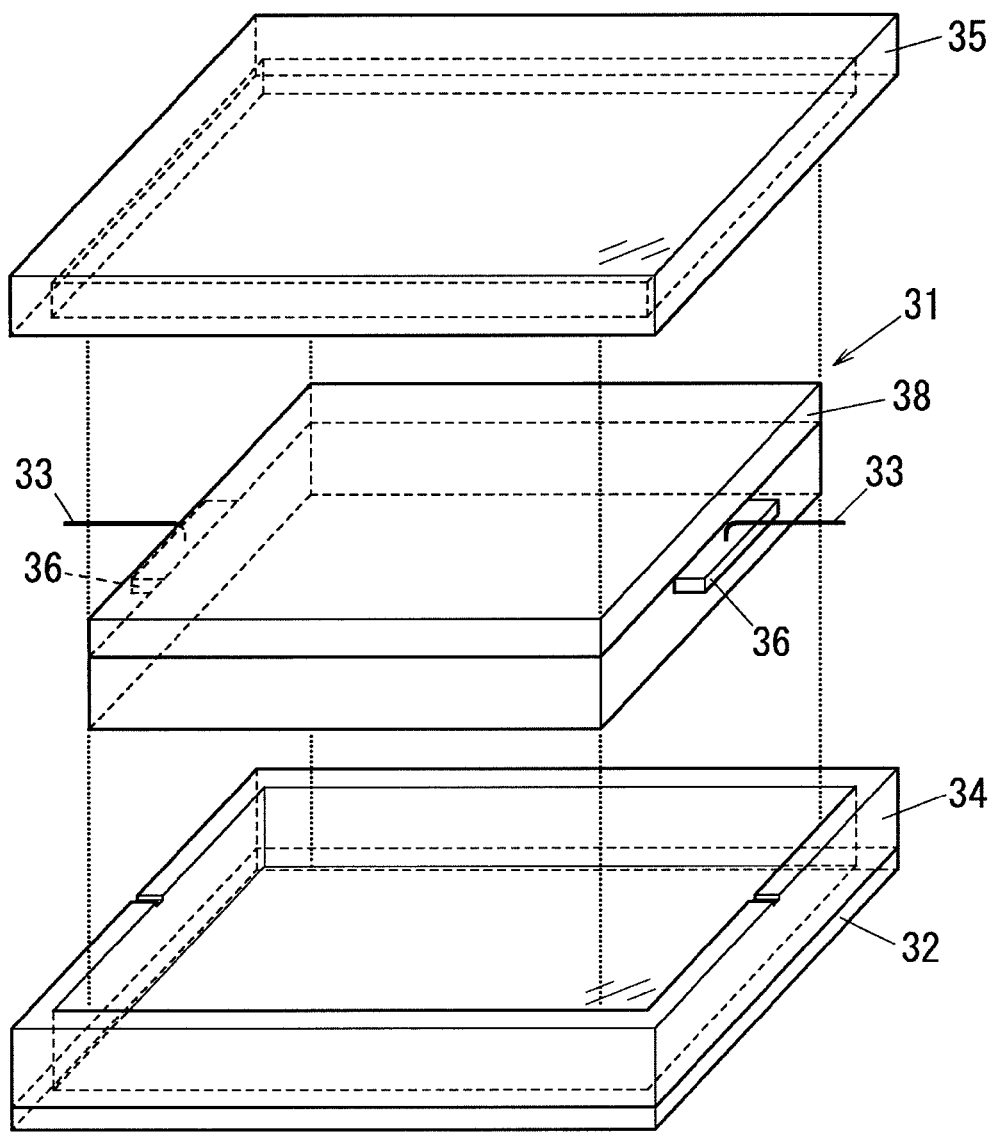
FIG. 4 is an exploded perspective view of the lighting fixture.
Figure 5:
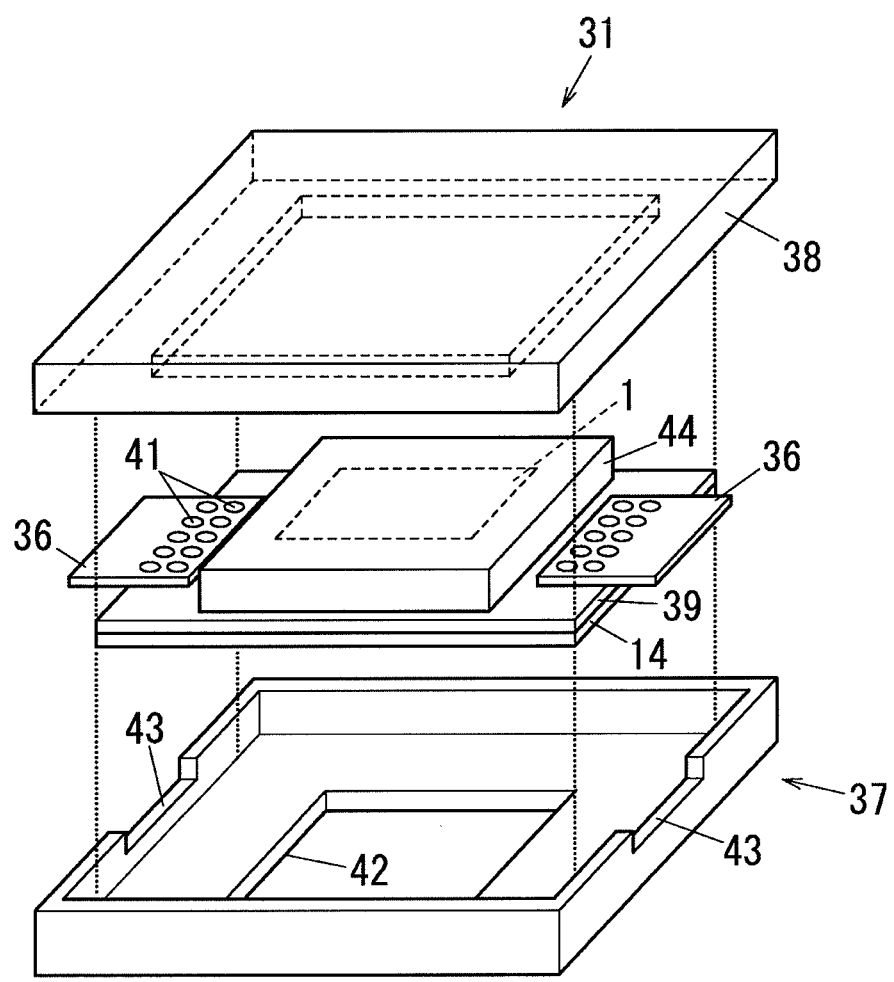
FIG. 5 is an exploded perspective view showing a unit in the lighting fixture.

In the present embodiment, the lighting fixture 3 includes the organic electroluminescent element 1, a connection terminal connecting the organic electroluminescent element 1 and a power source, and a housing holding the organic electroluminescent element 1. FIGS. 3 to 5 show one instance of the lighting fixture 3 including the organic electroluminescent element. The lighting fixture 3 includes: a unit 31 that includes the organic electroluminescent element 1; a housing that holds the unit 31; a front panel 32 that transmits light emitted from the unit 31; and wiring units 33 for supplying power to the unit 31.

The housing includes a front-side housing 34 and a back-side housing 35. The front-side housing 34 is formed into a frame shape, and the back-side housing 35 is formed into a lid shape having an open bottom. The front-side housing 34 and the back-side housing 35 are laid on top of each other so as to hold the unit 31 therebetween. The front-side housing 34 has grooves for allowing the wiring units 33 that are conductive leads, connectors, etc. to pass through, at a peripheral portion that comes into contact with the side wall of the back-side housing 35, and moreover, the plate-shaped front panel 32 having transparency is disposed at the open bottom.

The unit 31 includes the organic electroluminescent element 1, power supply parts 36 for supplying power to the organic electroluminescent element 1, a front-side case 37 and a back-side element case 38. The front-side case 37 and the back-side element case 38 hold the organic electroluminescent element 1 and the power supply units 36 therebetween.

A positive electrode 39 connected to the first electrode 15 and a negative electrode 40 connected to the second electrode 16 are formed on the substrate 14 of the organic electroluminescent element 1. A sealing substrate 44 is also provided on the substrate 14 to cover the organic electroluminescent element 1. The pair of power supply units 36 connected to the wiring units 33 come into contact with the positive electrode 39 and the negative electrode 40 respectively to supply power to the organic electroluminescent element 1.

One of the power supply parts 36 has a plurality of contacts 41 that make contact with the positive electrode 39 and the other includes a plurality of contacts 41 that make contact with the negative electrode 40. These contacts 41 are pressed against corresponding one of the positive electrode 39 and the negative electrode 40 by the element cases 37 and 38. Consequently, the power supply parts 36 are mechanically and electrically connected to the positive electrode 39 and the negative electrode 40 at many points, respectively. Each contact 41 is formed into a dimpled shape by performing a bending process on the power supply part 36 made of a metal conductor such as a copper plate or a stainless steel plate, and protrusions defined by the dimpled portions come into contact with corresponding one of the positive electrode 39 and the negative electrode 40. Note that for instance, the power supply part 36 may be a power supply unit obtained by providing a line-shaped metal conductor with coil-shaped contacts 41, instead of the power supply part obtained by providing a plate-shaped metal conductor with the dimpled contacts 41.

The element cases 37 and 38 are each formed into a lid shape. The front-side element case 37 is provided at a case wall facing the substrate 14 of the organic electroluminescent element 1 with an opening portion 42 for allowing light to pass, and is provided at a case side wall with groove portions 43 for receiving the power supply parts 36. The element cases 37 and 38 are formed of resin such as acryl or the like, and are laid on top of each other so that side walls thereof come into contact with each other to form a rectangular parallelepiped box shape, and hold the organic electroluminescent element 1 and the power supply parts 36 therebetween.

EXAMPLES

The first electrode 15 was formed by forming ITO into a film having a thickness of 130 nm on the glass substrate 14. Furthermore, a hole injection layer made of PEDOT/PSS and having a thickness of 35 nm was formed on the first electrode 15 with a wet method. Subsequently, the hole transport layer 3, the blue region light emitting layer 2 (fluorescence), the first green region light emitting layer 22 (fluorescence), and the electron transport layer 4 were successively formed so as to each have a thickness of 5 nm to 60 nm, with a vapor deposition method. Next, the interlayer 13 having a layer structure of Alq3/Li$_2$O/Alq3/HAT-CN6 was placed thereon with a layer thickness of 15 nm. Next, the hole transport layer 3, the red region light emitting layer 23 (phosphorescence), the second green region light emitting layer 24 (phosphorescence), and the electron transport layer 4 were successively formed so that each layer has a maximum film thickness of 50 nm. Subsequently, an electron injection layer constituted by a Li film and the second electrode 16 constituted by an Al film were successively formed. In the present example, the thickness of the red region light emitting layer 23 was 2 nm, and the thickness of the second green region light emitting layer 24 was 40 nm.

The peak wavelength of the emission spectrum of the dopant in the blue region light emitting layer 21 was 450 nm, the peak wavelength of the emission spectrum of the dopant in the second green region light emitting layer 24 was 563 nm, and the peak wavelength of the emission spectrum of the dopant in the red region light emitting layer 23 was 620 nm.

The spectrum, the various color rendering properties, and the color of light emitted from the organic electroluminescent element 1 were measured using a spectral radiance meter (CS-2000), and the obtained results were as follows.

The peak intensity proportion of blue (450 nm): green (563 nm): red (623 nm) in the emission spectrum of light emitted from the organic electroluminescent element 1 at an element temperature of 30° C. is 1:1.5:2.5.

The spectrum, the luminance, and the color of light emitted from the organic electroluminescent element 1 were measured using a spectral radiance meter (CS-2000), and the obtained results were as follows.

Figure 6:
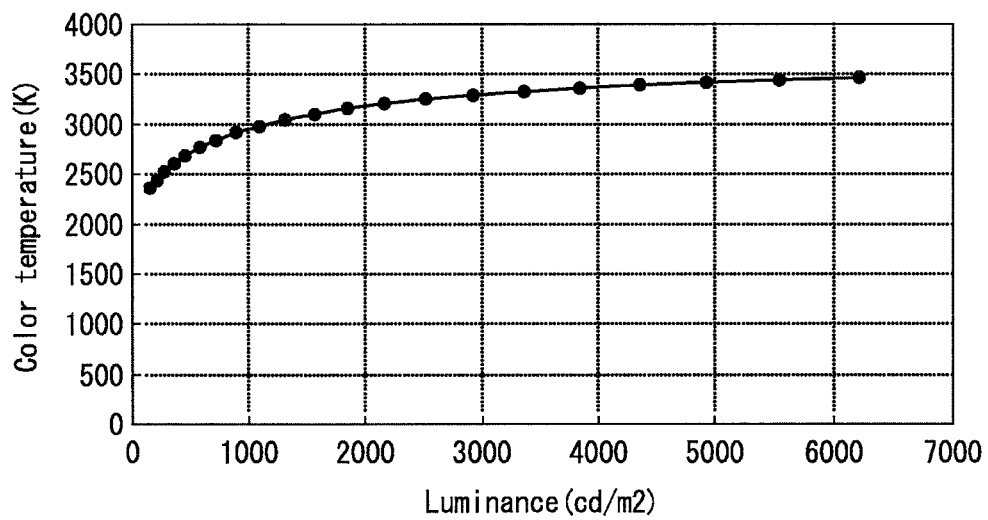
FIG. 6 is a graph illustrating a result of examination on a relation between luminance of light emitted in the front direction and a color temperature of the emitted light with regard to the organic electroluminescent element of the present example.

FIG. 6 shows a result of measurement of change in the color temperature of the emitted light with varying the luminance of the light emitted from the organic electroluminescent element 1. This result shows that the color temperature of the emitted light increases with an increase in the luminance of the emitted light. Further this result shows that the color temperature is 2350 K when the luminance of the emitted light is 100 cd/m$^2$ and the color temperature is 3400 K when the luminance of the emitted light is 5000 cd/m$^2$.

Figure 7:
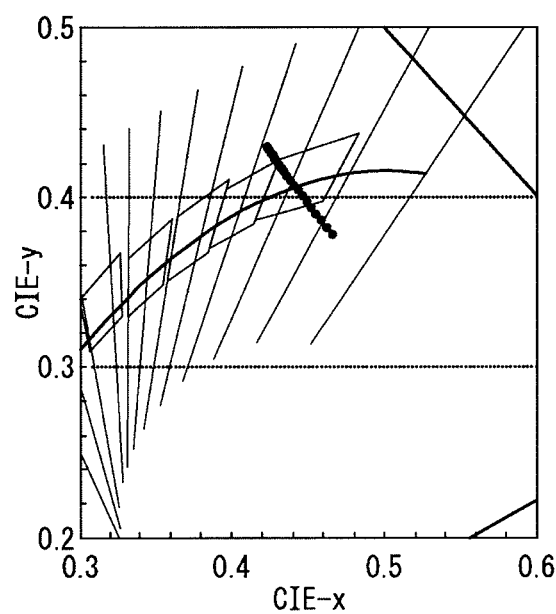
FIG. 7 is a graph illustrating a result of plotting change in color of emitted light accompanied with change in luminance of light emitted from the organic electroluminescent element of the present example in the front direction and a blackbody locus on an XY chromaticity diagram in CIE 1931 XYZ color space.

FIG. 7 shows a result of plotting change in the color of the emitted light accompanied with change in the luminance of the light emitted in a range of 100 to 5000 cd/m$^2$ with regard to the organic electroluminescent element 1, on the XY chromaticity diagram in CIE 1931 XYZ color space. This result shows that the locus representing the change in the emission color crosses the blackbody locus.

Further, another element which has the same configuration as the above except the red region light emitting layer has the film thickness of 1 nm and the second green region light emitting layer has the film thickness of 35 nm was prepared. Additionally, another element which has the same configuration as the above except the red region light emitting layer has the film thickness of 3 nm and the second green region light emitting layer has the film thickness of 40 nm was prepared. With regard to each of these elements, the spectrum, the various color rendering properties, and the color of light emitted therefrom were measured in a similar manner as the above examples. This result shows that, like the above example, the color temperature of the emitted light increases with an increase in the luminance of the emitted light and the locus representing the change in the emission color crosses the blackbody locus in the XY chromaticity diagram.

REFERENCE SIGNS LIST

1 Organic electroluminescent element
3 Lighting fixture

The invention claimed is:

1. An organic electroluminescent element comprising a plurality of stacked layers, wherein
the organic electroluminescent element has characteristics such that, in a range of 100 cd/m² to 6000 cd/m² inclusive, a color temperature of emitted light increases with an increase in a luminance of the emitted light in a direction identical to a direction in which the plurality of layers are stacked, and
characteristics such that, when the luminance of the emitted light the direction identical to the direction in which the plurality of layers are stacked falls within a range of 500 cd/m² to 3000 cd/m² inclusive, the color temperature of he emitted light falls within a white range defined by JIS Z9112.

2. The organic electroluminescent element according to claim 1, further having characteristics such that, when the luminance of the emitted light in the direction identical to the direction in which the plurality of layers are stacked falls within a range of 100 cd/m² to 5000 cd/m² inclusive, a difference between a maximum and a minimum of the color temperature of the emitted light is equal to 500 K or more.

3. The organic electroluminescent element according to claim 1, further having characteristics such that, in an XY chromaticity diagram in CIE 1931 XYZ color space, a locus representing a change in a color of the emitted light along with an increase in the luminance of the emitted light crosses a blackbody locus.

4. The organic electroluminescent element according to claim 1, further comprising a first electrode, a first light emitter, an interlayer, a second light emitter, and a second electrode which are stacked in this order,
wherein:
the first light emitter includes a blue region light emitting layer that emits blue light and a first green region light emitting layer that emits green light via fluorescence;
the second light emitter includes a red region light emitting layer that emits red light and a second green region light emitting layer that emits green light via phosphorescence; and
a ratio of a thickness of the red region light emitting layer to a thickness of the second green region light emitting layer falls within a range of 2 to 30%.

5. The organic electroluminescent element according to claim 4, wherein
the thickness of the second green region light emitting layer falls within a range of 10 nm to 40 nm.

6. A lighting fixture comprising the organic electroluminescent element according to claim 1.

* * * * *